United States Patent
Mei et al.

(10) Patent No.: US 10,490,746 B2
(45) Date of Patent: Nov. 26, 2019

(54) SELECTIVE SURFACE MODIFICATION OF OTFT SOURCE/DRAIN ELECTRODE BY INK JETTING F4TCNQ

(71) Applicant: Palo Alto Research Center Incorporated, Palo Alto, CA (US)

(72) Inventors: Ping Mei, San Jose, CA (US); Robert A. Street, Palo Alto, CA (US); Gregory L. Whiting, Menlo Park, CA (US); Sivkheng Kor, San Jose, CA (US); Steven E. Ready, Los Altos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 73 days.

(21) Appl. No.: 15/446,516

(22) Filed: Mar. 1, 2017

(65) Prior Publication Data

US 2018/0254302 A1    Sep. 6, 2018

(51) Int. Cl.
*H01L 51/00* (2006.01)
*H01L 27/28* (2006.01)
*H01L 51/10* (2006.01)

(52) U.S. Cl.
CPC ........ *H01L 51/0022* (2013.01); *H01L 27/283* (2013.01); *H01L 51/105* (2013.01)

(58) Field of Classification Search
CPC .............. H01L 51/0022; H01L 51/0508; H01L 51/0512; H01L 51/0541; H01L 51/0545; H01L 51/0558–0566; H01L 27/283
See application file for complete search history.

(56) References Cited

U.S. PATENT DOCUMENTS

| | | | | |
|---|---|---|---|---|
| 8,481,994 | B2* | 7/2013 | Burroughes | H01L 51/002 257/40 |
| 8,889,473 | B2* | 11/2014 | Benwadih | B82Y 30/00 257/E21.632 |
| 9,735,380 | B2* | 8/2017 | Koizumi | C23C 18/2086 |
| 9,997,709 | B2* | 6/2018 | Noh | H01L 21/041 |
| 2006/0055392 | A1 | 3/2006 | Passmore | |
| 2007/0040170 | A1 | 2/2007 | Cain | |
| 2011/0290296 | A1 | 12/2011 | Daniel et al. | |
| 2011/0290304 | A1 | 12/2011 | Daniel | |
| 2012/0297864 | A1 | 11/2012 | Abawi | |
| 2014/0311905 | A1 | 10/2014 | Stetter et al. | |

OTHER PUBLICATIONS

Colin Reese et al. "Organic Thin Film Transistors", Materials Today, vol. 7, Iss. 9, Sep. 2004, pp. 20-27; https://www.sciencedirect.com/science/article/pii/S1369702104003980 accessed Dec. 10, 2018.

* cited by examiner

*Primary Examiner* — Jose R Diaz
(74) *Attorney, Agent, or Firm* — Fay Sharpe LLP

(57) ABSTRACT

A method and system utilizes ink jetting or printing of surface work function modification material or solution to form modified p-type and/or n-type electrodes. The proposed method is suitable for making complementary OTFT circuits in roll-to-roll fabrication environment.

20 Claims, 10 Drawing Sheets

SELECTIVE SURFACE MODIFICATION OF OTFT SOURCE/DRAIN ELECTRODE BY INK JETTING F4TCNQ

BACKGROUND

In manufacturing complimentary Organic Thin Film Transistors (OTFTs) treatment of source and drain printed silver (Ag) electrodes for the p-type or n-type OTFT is at times undertaken in order to modify the work function of the source and drain electrodes. Such electrode modification is typically conducted using non-selective processing techniques which include an immersion of the substrate in a modifier solution. This then requires additional steps including at least those of material removal and/or cleaning such as of the solvent. It is therefore considered useful to provide methods and systems employing more selective processing techniques, which in turn streamlines and simplifies the overall manufacturing of OTFTs.

BRIEF DESCRIPTION

Provided is a method of fabricating a complementary top gate OTFT which includes, providing a substrate; patterning source and drain electrodes for a p-type OTFT on the buffer layer and patterning source and drain electrodes for an n-type OTFT on the buffer layer; printing, by the printing system, at least one of (i) the first surface work function modifier onto surfaces of the source and drain electrodes for the p-type OTFT and (ii) the second surface work function modifier onto surfaces of the source and drain electrodes for the n-type OTFT; printing by the printing system, a p-type of semiconductor material into at least a channel region between the source and drain electrodes for the p-type-OTFT; printing by the printing system, an n-type of semiconductor material into at least a channel region between the source and drain electrodes for the n-type OTFT; forming a dielectric layer over the p-type semiconductor material, the n-type semiconductor material and the source and drain electrodes including at least one of (i) the modified surfaces of the source and drain electrodes for the p-type OTFT, and (ii) the modified surfaces of the source and drain electrodes for the n-type OTFT; and forming gate electrodes on a surface of the dielectric layer.

The method further includes at least one of (i) printing the first surface work function modifier onto the surfaces of the source and drain electrodes for the p-type OTFT without printing on the buffer layer, wherein only the surfaces of the source and drain electrodes for the p-type OTFT are modified, and (ii) printing the second energy modifier onto the surfaces of the source and drain electrodes for the n-type OTFT without printing on the buffer layer, wherein only the surfaces of the source and drain electrodes for the n-type OTFT are modified.

The method further includes (i) printing the first surface work function modifier onto only the surfaces of the source and drain electrodes for the p-type OTFT without printing on the buffer layer, wherein only the surfaces of the source and drain electrodes for the p-type OTFT are modified, and (ii) printing the second energy modifier onto only the surfaces of the source and drain electrodes for the n-type OTFT without printing on the buffer layer, wherein only the surfaces of the source and drain electrodes for the n-type OTFT are modified.

The method further includes dissolving the first surface work function modifier into a flowing state, wherein the dissolved first surface work function modifier is configured to modify the surfaces of the source and drain electrodes for the p-type OTFT, and providing at least one of (i) the dissolved first surface work function modifier for the p-type OTFT and (ii) the second surface work function modifier to the printing system.

The method further includes the first surface work function modifier is a F4TCNQ composition.

The method further includes dissolving of the F4TCNQ which is accomplished by dissolving 0.1 weight % F4TCNQ in dichlorobenzene.

The method further including a second surface work function modifier which may selected from, but is not limited to, a group consisting of 4-Methyl (sulfanyl)thiophenol, 4-methoxythiophenol, 4-methylthiophenol, 4-aminothiophenol, and 4-nitrothiophenol nitrothiophenol.

The method further includes roughing the surface of at least the buffer layer, prior to the printing system printing at least one of (i) the first surface work function modifier onto the surfaces of the source and drain electrodes for the p-type OTFT, and (ii) the second surface work function modifier onto the surfaces of the source and drain electrodes for the n-type OTFT.

The method further includes the roughing of at least the buffer layer being accomplished by providing an argon or oxygen plasma treatment to the surface of the buffer layer.

The method further includes that the steps forming the complimentary OTFT are undertaken in a roll to roll fabrication process.

The method wherein for efficient charge carrier injection into p-type organic molecules of the p-type material, a work function of the surfaces of the source and drain electrodes for the p-type OTFT are modified to substantially match an energy level of a highest occupied molecular orbital (HOMO) of the p-type organic molecules.

The method wherein for efficient charge carrier injection into n-type organic molecules of the n-type material, a work function of the surfaces of the source and drain electrodes for the n-type OTFT are modified to substantially match an energy level of the lowest unoccupied molecular orbital (LUMO) of the organic molecules of the n-type organic molecules.

The method further includes wherein the printing deposits droplets in a volume range of approximately 100 pL/mm$^2$ to 10 nL/mm$^2$ and more particularly a volume range of 200 pL/mm$^2$ to 3000 pL/mm$^2$ of at least one of (i) the first surface work function modifier and the (ii) second surface work function modifier, on a surface area between approximately 100 pL/mm$^2$ to 10 nL/mm$^2$ and more particularly 200 pL/mm$^2$ to 3000 pL/mm$^2$ of at least one of (i) the source and drain electrodes for the p-type OTFT, and (ii) the source and drain electrodes for the p-type OTFT.

The method further includes wherein the printiner system deposits droplets with a 60 µm to 80 µm jetting nozzle on at least one of (i) the source and drain electrodes for the p-type OTFT, and (ii) the source and drain electrodes for the n-type OTFT.

The method further includes wherein a nozzle head of the printer system is maintained at a temperature of between 30° C. to 60° C. to maintain the first surface work function modifier in the form of a F4TCNQ composition in a stable flowing state.

The method further includes heating at least one of (i) the printed first surface work function modifier and the surfaces of the source and drain electrodes for the p-type OTFT to form modified surfaces of the source and drain electrodes for the p-type OTFT, and (ii) the printed second surface work function modifier and the surfaces of the source and drain electrodes for the n-type OTFT, to form modified surfaces of the source and drain electrodes for the n-type OTFT.

Provided is a complementary top gate OTFT which includes a substrate; a buffer layer positioned on a surface of the substrate; patterned source and drain electrodes located on the buffer layer for a p-type OTFT and an n-type OTFT; at least one of (i) modified surfaces of the source and drain electrodes for the p-type OTFT, the modified surfaces of the source and drain electrodes for the p-type OTFT including a first surface work function modifier located on substantially only the surfaces of the source and drain electrodes for the p-type OTFT, and (ii) modified surfaces of the source and drain electrodes for the n-type OTFT, the modified surfaces of the source and drain electrodes for the n-type OTFT including a second surface work function modifier located on substantially only the surfaces of the source and drain electrodes for the n-type OTFT; a p-type of semiconductor located in at least a channel region between the source and drain electrodes for the p-type-OTFT; an n-type of semiconductor material located in at least a channel region between the source and drain electrodes for the n-type OTFT; a dielectric layer deposited over p-type semiconductor material, the n-type semiconductor material, and the source and drain electrodes, including at least one of (i) the modified source and drain electrodes for the p-type OTFT, and (ii) the modified source and drain electrodes for the n-type OTFT; gate electrodes formed on a surface of the dielectric; vias located through the dielectric layer to selected ones of the source and drain electrodes including at least one of (i) the modified surface of the source electrode for the p-type OTFT, and (ii) the modified surface of the drain electrode for the n-type OTFT, the vias filled with a conductive material.

The complementary top gate OTFT wherein the first surface work function modifier is a F4TCNQ composition dissolved in a solution of 0.1 weight % F4TCNQ in dichlorobenzene.

The complementary top gate OTFT wherein the second surface work function modifier which may be selected from, but is not limited to, a group consisting of 4-Methyl (sulfanyl)thiophenol, 4-methoxythiophenol, 4-methylthiophenol, 4-aminothiophenol, and 4-nitrothiophenol nitrothiophenol.

The complementary top gate OTFT wherein a surface of at least the buffer layer has a roughened surface.

DETAILED DESCRIPTION

Figure 1:
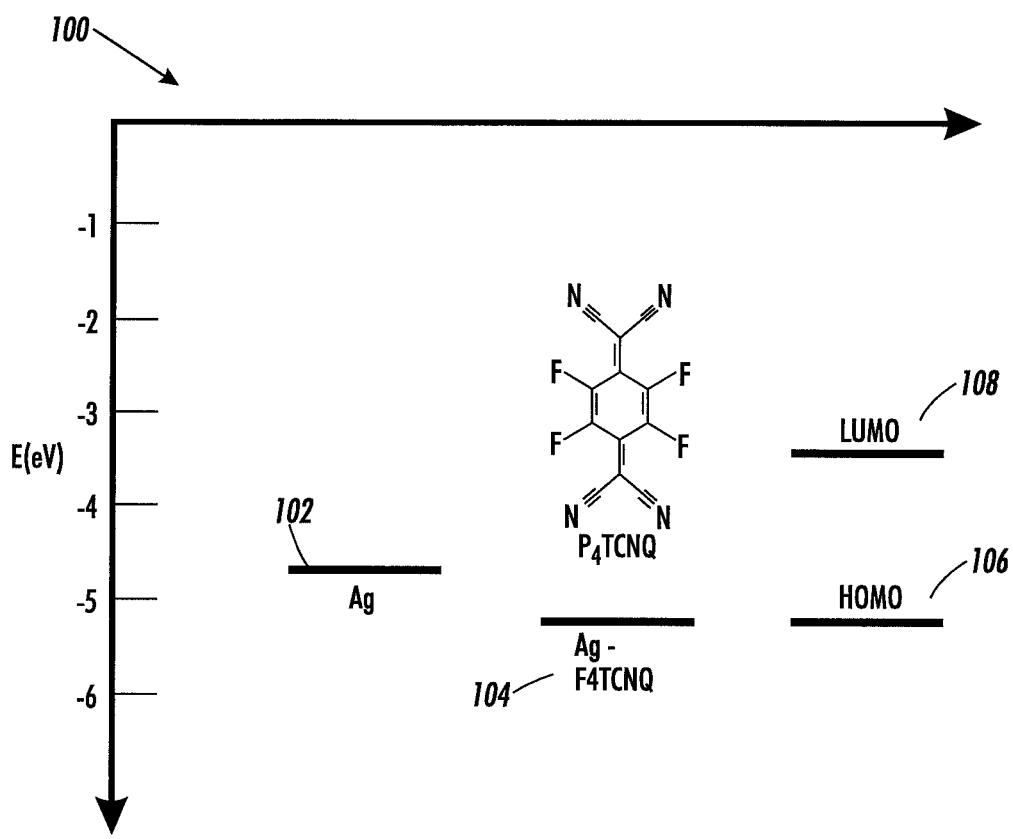
FIG. 1 is an energy level diagram of pristine silver (Ag), F4TCNQ modified Ag, and p-type organic semiconductor material.

With reference to FIG. 1, illustrated is an energy level chart 100, identifying an energy level for pristine silver (Ag) 102, an energy level for modified Ag-F4TCNQ (organic electron acceptor 2,3,5,6-tetrafluoro-7,7,8,8-tetracyanoquinodimethane) modified electrode 104, an energy level for a highest occupied molecular orbital (HOMO) of the organic molecules of a p-type semiconductor material 106, and an energy level for a lowest occupied molecular orbital (LOMO) of the n-type semiconductor material 108.

For an efficient charge carrier injection into p-type organic molecules, the work function of the electrode is to substantially match the energy level of the highest occupied molecular orbital (HOMO) of the organic molecules for the p-type semiconductor 106. To improve organic transistor performance, the achievement of energy level alignment at organic layer and source and drain electrodes interfaces are desired for a beneficial ohmic contact. It has been known that a work function of source and drain electrodes can be tuned by using various dipolar self-assembled monolayers (SAMs) on the source and drain electrodes. Surface modifications of metal (e.g., Ag or other metal) electrodes via SAMs are employed to reduce the charge injection barrier at the organic molecules/metal interfaces. For example, the modification of ink-jet printed silver (Ag) electrodes with the organic electron acceptor 2,3,5,6-tetrafluoro-7,7,8,8-tetra-cyanoquinodimethane (F4TCNQ) can produce charge transfer complexes with silver to alter the work function from −4.70 eV to −5.15. As shown in FIG. 1, this type of modification improves energy level alignment between source and drain electrodes modified as Ag-F4TCNQ 104 and the p-type organic semiconductor HOMO 106.

Processes presently used to manufacture p-type organic Thin Film Transistor (OTFT) devices fabricated in a bottom contact (top gate) manner, commonly the print source and drain electrode(s) on a substrate, such as a Polyethylene naphthalate (PEN) plastic substrate.

In existing processes the SAM layer is formed by immersing the printed Ag electrodes in 0.1 weight % F4TCNQ in dichlorobenzene for 5-10 minutes. The substrate is then removed from the solution and cleaned (e.g., rinsed) with dichlorobenzene followed by N2 gas drying.

For n-type OTFT devices, the work function of the electrode should be close to the energy level of the lowest occupied molecular orbital (LOMO) of the n-type semiconductor material in order to form a appropriate ohmic contact between the source and drain electrodes and the semiconductor. In various processes pristine Ag or gold without without surface treatment is used for n-type OTFT.

Figure 2:
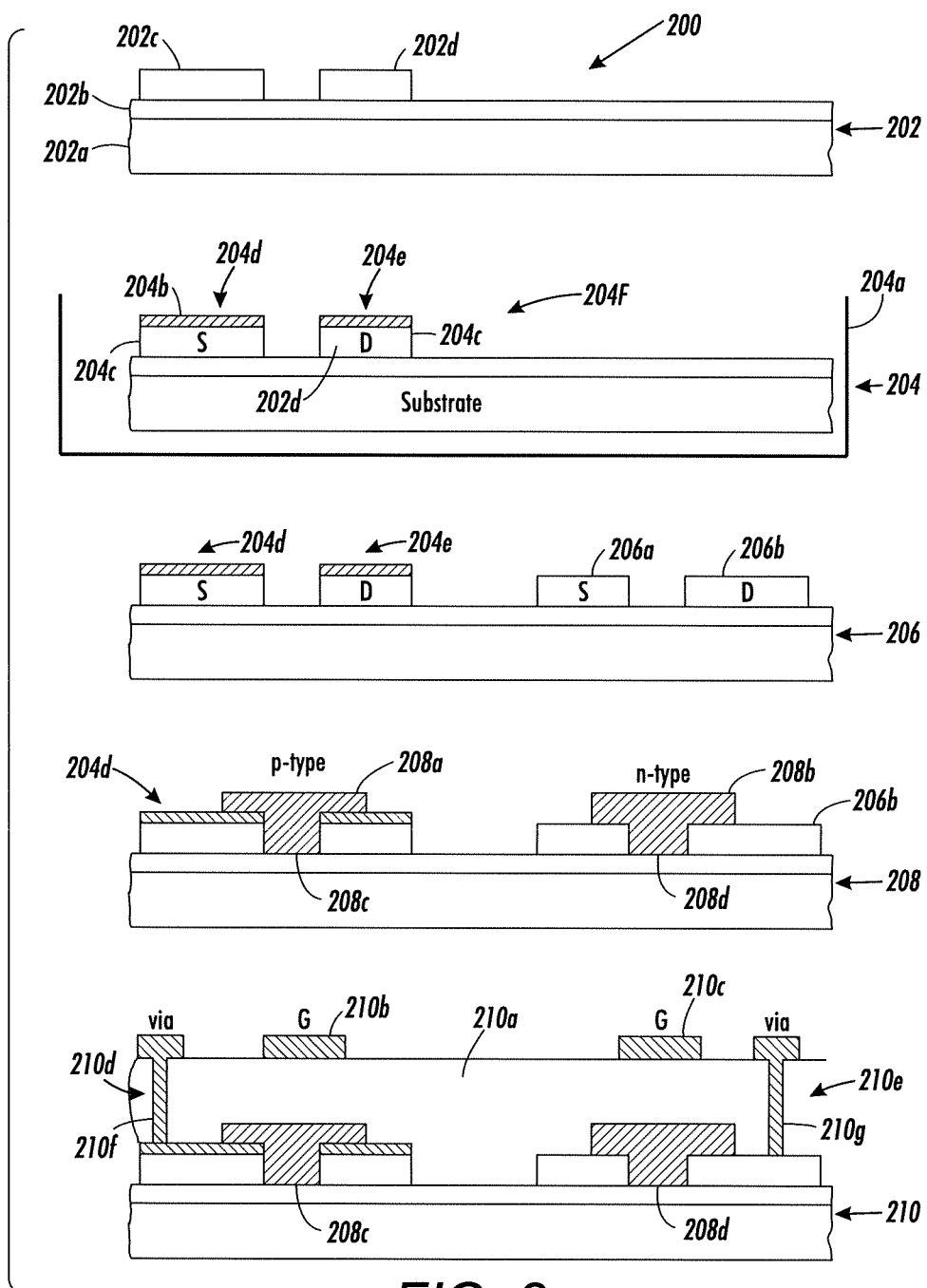
FIG. 2 illustrates processing steps for making a complementary circuit with p- and n-type OTFTs as known in the art.

FIG. 2 describes conventional processing steps 200 of making complementary p- and n-type OTFTs circuits.

Initially, in a step 200 provided is a substrate 202a, and a buffer layer 202b positioned on a surface of the substrate 202a. Source and drain electrodes 202c, 202d for p-type OTFTs are formed on the buffer layer 202b which coats the substrate 202a. The source electrode 200c and drain electrode 202d are sintered Ag electrodes. Then in step 204 these electrodes 202c, 202d are treated by immersion into a surface work function modifier (e.g., F4TCNQ) solution or composition 204a. Thereafter, following removal from the surface work function modifier solution, rinse and dry operations are performed on the arrangement, wherein layers of the surface work function modifier solution 204b, 204c remain on the surface of the electrodes 202c, 202d, wherein these operations form modified source electrode 204d and modified drain electrode 204e. In step 206 Ag source and drain electrodes 206a, 206b for n-type OTFTs are printed and sintered. In step 208 p-type semiconductor material 208a and n-type semiconductor material 208b are jetted (e.g., printed or deposited) onto respective channel region regions 208c, 208d between the respective electrodes, including the modified source and drain electrodes 204d, 204e, and source and drain electrodes 206a, 206b (without surface work function modification) respectively. Thereafter, in step 210 a dielectric layer 210a is formed, and gates 210b, 210c are formed on a surface of the dielectric layer 210a. Finally, vias or openings 210d, 210e filled with conductive material 210f, 210g provide a conductive path to the surface of the dielectric layer 210a.

In the above processing steps the forming of pristine Ag n-type electrodes relies on printing n-type electrodes after F4TCNQ treatment of the p-type electrodes has taken place. Therefore, it requires separate printing processes for p-type and n-type electrodes. This is not, however, possible when a pre-fabricated substrate with electrode patterns is used. In addition, immersion operations add complications for roll-to-roll OTFT manufacturing processes.

To overcome the above and other problems, disclosed are methods and systems for selectively and precisely printing or depositing surface work function modifier(s) on to electrode surfaces to form energy modified surfaces of p-type electrodes and/or n-type electrodes, also referred to herein as modified source and/or drain electrodes for p-type electrodes and/or n-type electrodes for p-type OTFTs and/or n-type OTFTs respectively. It is also noted that while the present discussion focuses on OTFTs, concepts described herein may be applied to other TFT circuits as well as other electronic devices which would benefit from these teachings.

Figure 3:
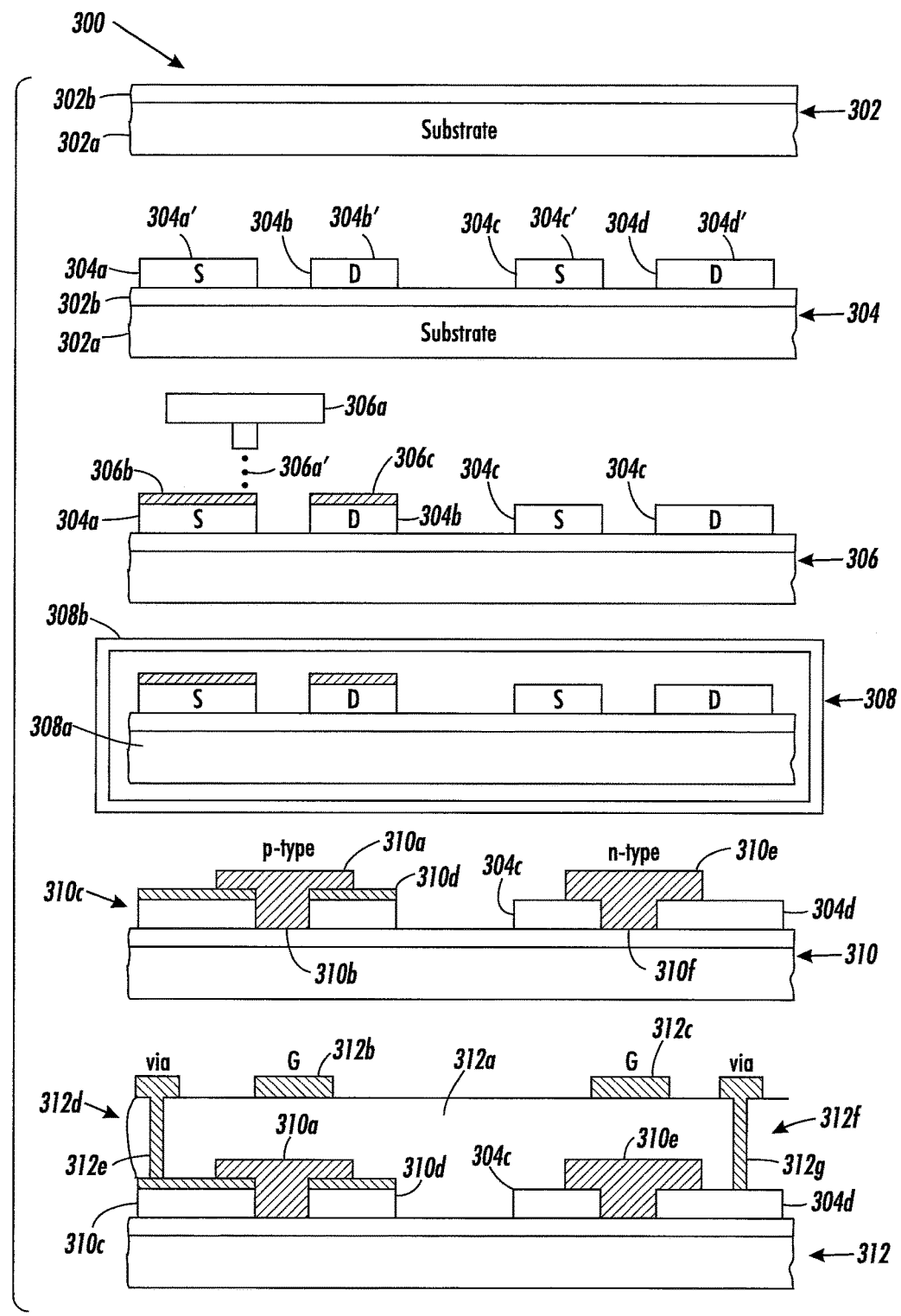
FIG. 3 illustrates processing steps for making a complementary top gate OTFT circuit with selective p-type electrosurface modifications according to the present disclosure.

Turning now to FIG. 3 illustrated are processing steps for a manufacturing method according to the present disclosure.

The process 300 of FIG. 3 begins with step 302 which provides a substrate 302a and a buffer layer 302b provided in a manner which is known in the art. The substrate and buffer layer are at times referred to herein as simply the substrate, and/or at times a substrate may be used without a buffer layer. In step 304, source electrode 304a, and drain electrode 304b for a p-type OTFT, and source electrode 304c and drain electrode 304d for an n-type OTFT are patterned on top of buffer layer 302b, where source electrode 304a includes a surface 304a', drain electrode 304b includes a surface 304b', source electrode 304c includes a surface 304c', and drain electrode 304d includes a surface 304d'.

These electrodes (304a-304d) are formed by ink jetting or metal deposition followed by conventionally known photolithography and etching or other known techniques.

Turning to step 306, to selectively modify electrodes 304a, 304b for p-type OTFT devices, provided is a printing system 306a, configured to print a surface work function modifier material or solution, such as in the form of droplets 306a', on to surfaces 304a', 304b' of the source and drain electrodes 304a, 304b for a p-type OTFT. In one embodiment, the surface work function modifier is a F4TCNQ ink or solution, which in an embodiment is formed by dissolving approximately 0.1 weight % F4TCNQ in dichlorobenzene. In an embodiment the printing system 306a employees a 60 μm to 80 μm nozzle (such as a MicroFab nozzle), although it is understood other printing systems and nozzles may be used. In order to maintain a stable fluidic state for the F4TCNQ material the nozzle head is heated and maintained at approximately 30° C. to 60° C., and more particularly 50° C. during the ink-jetting (or printing) of the droplets. For sufficient reaction between F4TCNQ with the surfaces 304a', 304b' of the Ag electrodes 304a, 304b, multiple droplets are applied to the p-type electrodes 304a, 304b. Thus, the printing operations selectively deposit a layer of the surface work function modifier (e.g., F4TCNQ) 306b, 306c on the surfaces 304a', 304b' of the electrodes 304a, 304b. The droplet volume of the surface work function modifier (e.g., F4TCNQ) material is between approximately 100 pL/mm$^2$ to 10 nL/mm$^2$ or more particularly 200 pL/mm$^2$ to 3000 pL/mm$^2$. Where droplet volume is the total volume of individual droplets deposited on both of the surfaces of the source electrode and drain electrode for a particular p-type OTFT. The droplets being deposited on an electrode surface area (including the source electrode and drain electrode for the p-type OTFT) of approximately between approximately 100 pL/mm$^2$ to 10 nL/mm$^2$ or more particularly 200 pL/mm$^2$ to 3000 pL/mm$^2$.

It is noted that distinct from previously employed processes, an example of such is described in connection with FIG. 2, the present process of FIG. 3 (and those of FIGS. 6 and 8) continues without the use or requirement of immersion or submersion of the electrodes into a bath of a surface work function modifier solution. Also not required is the applying of a solvent rinse to remove unwanted surface work function modifier solution. This solvent rinsing or other cleaning steps are not needed as the present processes do not use the step of immersion, but rather used precise selective printing of the energy surface modification material onto surfaces of the desired electrodes. It is also noted that all of the electrodes (304a-304d) maybe formed in the same step, unlike the process of FIG. 2.

With continuing attention to process 300, following the jetting of the first surface work function modifier (e.g., F4TCNQ), as shown in step 308, sample 308a (which includes substrate 302a, buffer layer 302b, electrodes 304a-304d, and the surface work function modified layers 306b, 306c) is provided to an heater (e.g., a vacuum oven) 308b where in one embodiment the sample 308a is annealed at about 120° C. for approximately 5 minutes. This heating (i.e., after the ink jetting or printing, etc.) acts to remove undesirable solvents that are otherwise present due to previous manufacturing steps. The described operations act to modify the surface energy level such as discussed in connection with FIG. 1. Achievement of energy level alignment is useful for appropriate ohmic contact. Surface modifications reduce the charge injection barrier at the organic molecules/metal interfaces. For example, again as discussed in connection with FIG. 1 and now FIG. 3 the modification of ink-jet or printed silver (Ag) electrodes with the organic electron acceptor 2,3,5,6-tetrafluoro-7,7,8,8-tetracyanoquinodimethane (F4TCNQ) produce charge transfer complexes with silver to alter the work function from 4.70 eV to 5.15 eV. This type of modification improves energy level alignment between the modified electrode 104 and the p-type organic semiconductor HOMO 106.

Following the heating process, as shown in step 310, a p-type semiconductor material 310a is jetted or printed into the channel region 310b. It is noted printing of the p-type material 310a also extends over onto a portion of an upper surface of modified source electrode 310c and modified drain electrode 310d for the p-type OTFT. Similarly, in step 310, n-type material 310e is jetted (or printed) into channel 310f. Further, some of the n-type semiconductor material 310e extends onto surfaces of the unmodified source electrode 304c and the drain electrode 304d. In other words, these electrodes are of the same metal structure as in step 304, whereas the electrodes for the p-type OTFT in step 310 have been modified from the electrode structure composition of the electrodes 304a and 304b of step 304.

Thereafter, in step 312, a dielectric layer 312a is provided over the electrodes 310c, 310d, 304c, 304d, as well as the p-type semiconductor material 310a, and the n-type semiconductor material 310e. Thereafter, gate electrodes 312b and gate electrodes 312c are printed on the surface of dielectric layer 312a. In further processing, via 312d is formed in dielectric layer 312a for contact with the modified source electrode 310c and thereafter a conductive material 312e is provided for a pathway for the modified source electrode 310c to the surface of dielectric layer 312a. Similarly, a via 312f is formed in the dielectric layer 312a to the unmodified drain electrode 304d and a conductive material 312g is provided in the via to form a contact portion to the upper surface of dielectric layer 312a.

Figure 4:
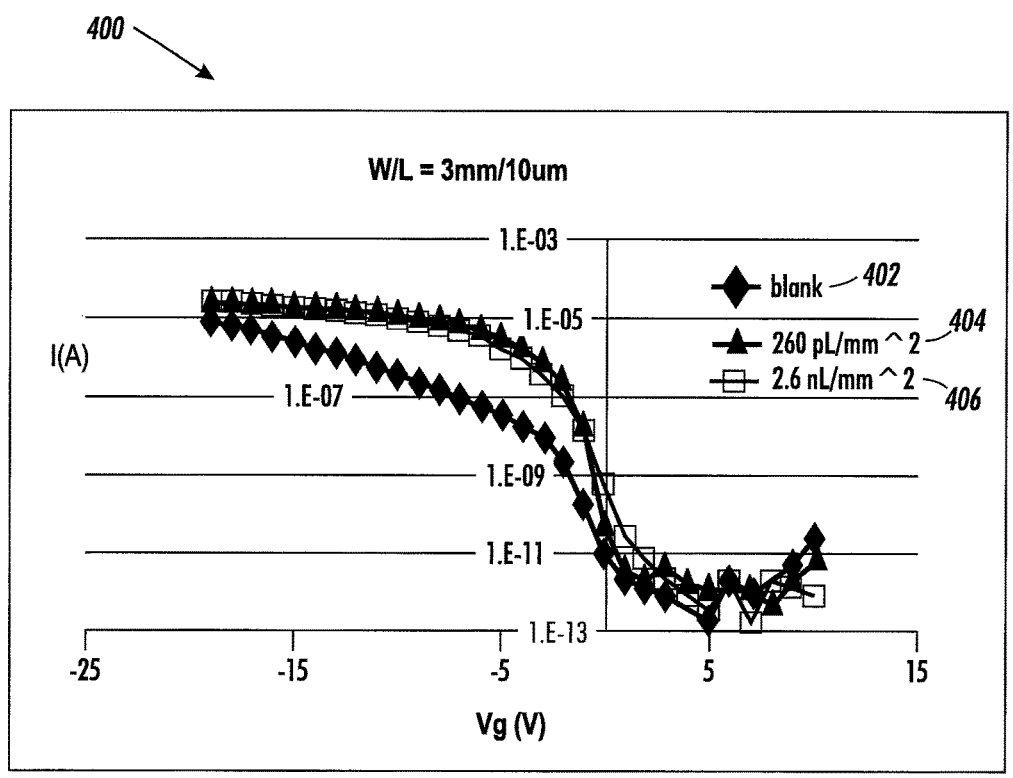
FIG. 4 is a graph of transistor transfer characteristics for OTFTs with different source and drain electrode treatments.

Shown in FIG. 4 is a chart 400 depicting transfer characteristics (i.e., current I(A) versus gate voltage (Vg (V)), with a width length ratio of W/L=3 mm/10 µm, at source/drive voltage of −10V. Compared with untreated device (blank) 402, OTFTs with 260 pL/mm$^2$ F4TCNQ droplet volume 404 and 2.6 nL/mm$^2$ F4TCNQ droplet volume 406 have higher ON currents and sharper subthreshold slopes.

Figure 5:
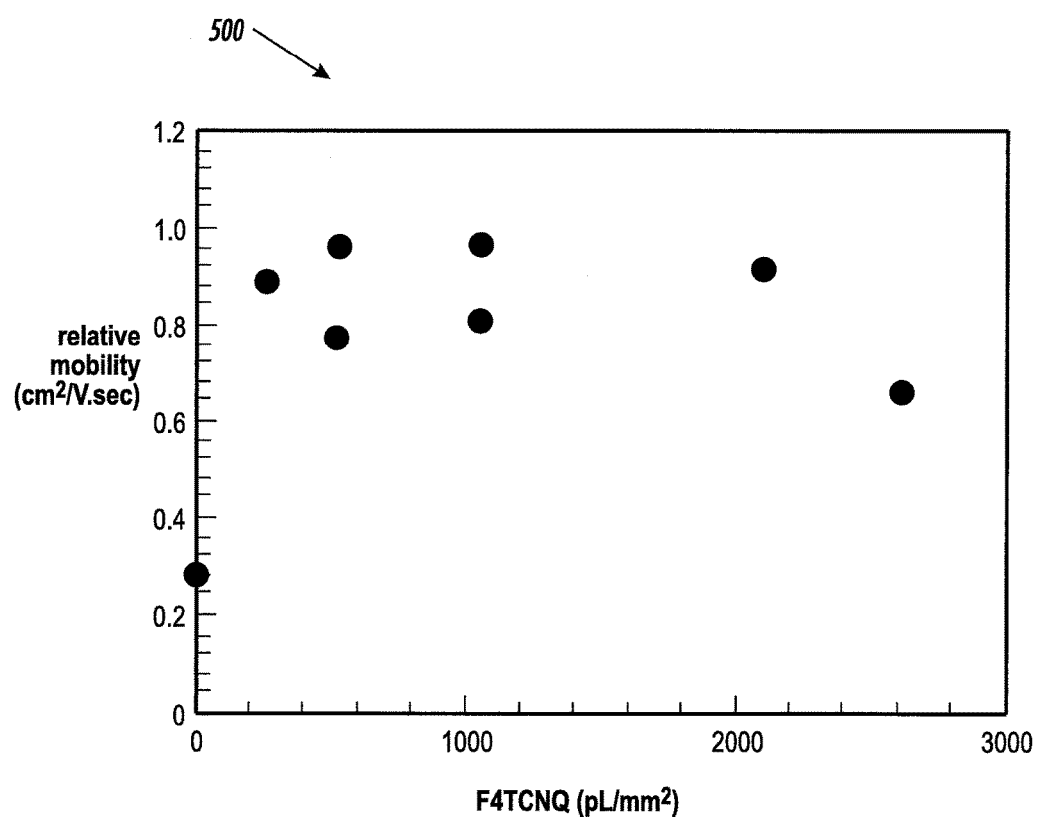
FIG. 5 illustrates a graph of relative mobility versus F4TCNQ drops measured for devices with a channel length of 10 μm.

FIG. 5 illustrates a chart 500 of relative mobility (Relative Mobility L=10 µm; channel length of 10 µm) versus F4TCNQ on the electrode surfaces (i.e., a volume of 0 pL/mm$^2$ to 3000 pL/mm$^2$). This data indicates relative mobility of a circuit configured according to the concepts of FIG. 3 where at 0 pL/mm$^2$ the relative mobility is approximately 0.3 cm$^2$/V.sec, between about 300 pL/mm$^2$ to 2000 pL/mm$^2$, relative mobility is between about 0.78 cm$^2$/V.sec to 0.98 cm$^2$/V.sec, and then decreases to about 0.7 cm$^2$/V.sec at approximately 2500 pL/mm$^2$.

The fabrication process shown in FIG. 3 can apply to other printed source and drain metal materials, such as but not limited to copper or nickel, and to source and drain metals patterned by vacuum deposition and conventional photolithography.

While F4TCNQ is a surface work function modifier which may be used in the process steps related to FIG. 3, it is understood however other dipolar SAM materials capable of surface work function modification are known and may be used dependent on the organic semiconductors that are used to form the complementary OTFT. Such surface work function modifiers for p-type semiconductors include but are not limited to thiol-based SAMs including thiophenol, 4-fluorothiophenol, and pentafluorothiophenol. The disclosure also applies to other advantaged combinations of printable surface work function modifiers and organic semiconductors that may be synthesized in the future.

In the present embodiments the p-type and n-type semiconductor materials may include those known in the art which are appropriate for the present concepts.

Figure 6:
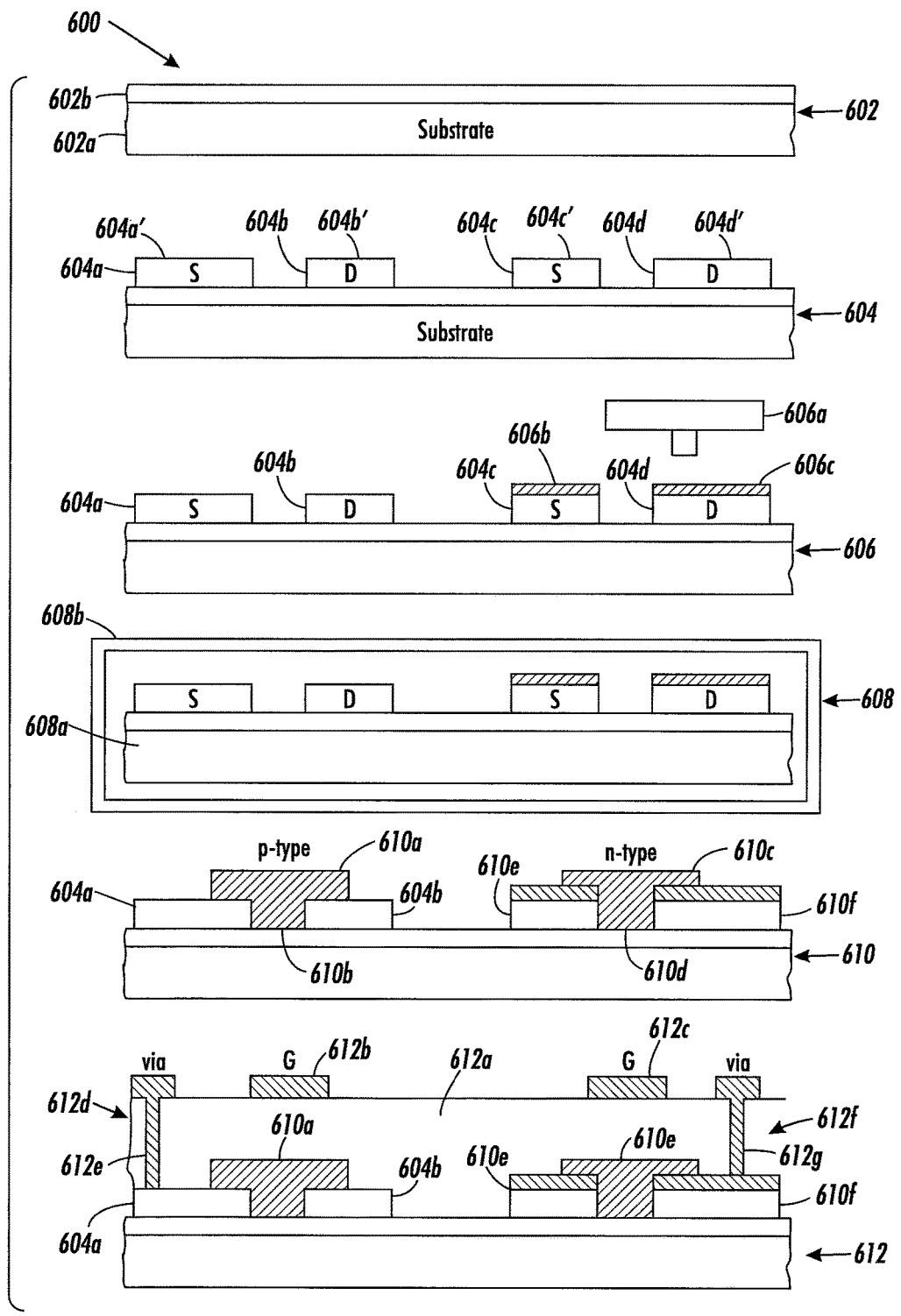
FIG. 6 depicts processing steps for making a complementary top gate circuit with selective n-type electrode surface modifications according to the present disclosure.

Turning now to FIG. 6, illustrated is a process 600 wherein the modified electrodes are the electrodes related to the n-type OTFT. Similar to FIG. 3, in step 602, a substrate 602a and a buffer layer 602b are provided.

Then in step 604, a source electrode 604a, drain electrode 604b for a p-type OTFT are formed, along with a source electrode 604c and a drain electrode 604d for a n-type OTFT. These electrodes can be made by ink jetting (or printing) or metal deposition followed by conventional photolithography and etching or in other manners known in the art. It is also noted that source electrode 604a includes an upper surface 604a', drain electrode 604b includes an upper surface 604b', source electrode 604c includes an upper surface 604c', and drain electrode 604d includes an upper surface 604d'.

Thereafter, in step 606, provided is a printing system 606a, which is used to ink jet or print another (e.g., second) surface work function modifier material or solution 606b, 606c onto upper surfaces of source electrode 604c and drain electrode 604d. The surface work function modifier for the n-type OTFT may be selected from, but is not limited to methoxythiophenol, 4-methylthiophenol, 4-aminothiophenol, and 4-nitrothiophenol nitrothiophenol. In addition to the foregoing, for some choices of source and drain metal materials, or organic semiconductors, a printed surface work function modifier (dipolar SAM), such as but not limited to polyethyleneimine ethoxylated (PETE), on the n-channel OTFT can also be used.

The droplet volume of the surface work function modifier material for the n-type OTFT is approximately between 100 pL/mm$^2$ to 10 nL/mm$^2$ and more particularly 200 pL/mm$^2$ to 3000 pL/mm$^2$. Where droplet volume is the total volume of individual droplets deposited on both of the surfaces of the the source electrode and drain electrode for a particular n-type OTFT. The droplets being deposited on an electrode surface area (including the source electrode and drain electrode for the n-type OTFT) of between approximately 100 pL/mm$^2$ to 10 nL/mm$^2$ and more particularly 200 pL/mm$^2$ to 3000 pL/mm$^2$.

Also, the nozzle of the printing system for depositing the surface work function modifier for the n-type OTFT is able to operate at room temperature without additional heating.

Following the actions of step 606 the process moves to step 608, where the sample 608a (which includes substrate 602a, buffer layer 602b, electrodes 604a, 604b, 604c, 604d, layer 606b and layer 606c) is placed in an oven (e.g., a vacuum oven) 608b at 120° C. for approximately 5 minutes to anneal. This heating (i.e., after the ink jetting or printing, etc.) acts to remove undesirable solvents that are otherwise present due to previous manufacturing steps. The described operations act to modify the surface energy level such as discussed in connection with FIG. 1.

Thereafter, in step 610, a p-type semiconductor material 610a is printed or otherwise deposited into a channel 610b between unmodified source electrode 604a and unmodified drain electrode 604b and a n-type semiconductor material or ink 610c is deposited within a channel 610d between modified source electrode 610e and modified drain electrode 610f.

Next, in step 612, a dielectric layer 612a is deposited over the electrodes 604a, 604b, 610e, 610f, as well as the p-type semiconductor material 610a and 610c. On a surface of the dielectric material, gates 612b and 612c are formed. Further, a via 612d is formed from the surface of the dielectric material 612a to the unmodified source electrode 604a which is then filled with a conductive material 612e. Similarly, a via 612f is formed in the dielectric material 612a from the modified drain electrode 610f to the surface of the dielectric layer 612a. Thereafter, a conductive material 612g fills the via 612f forming a conductive path from the modified drain electrode 610f to the surface of the dielectric layer 612a.

Figure 7:
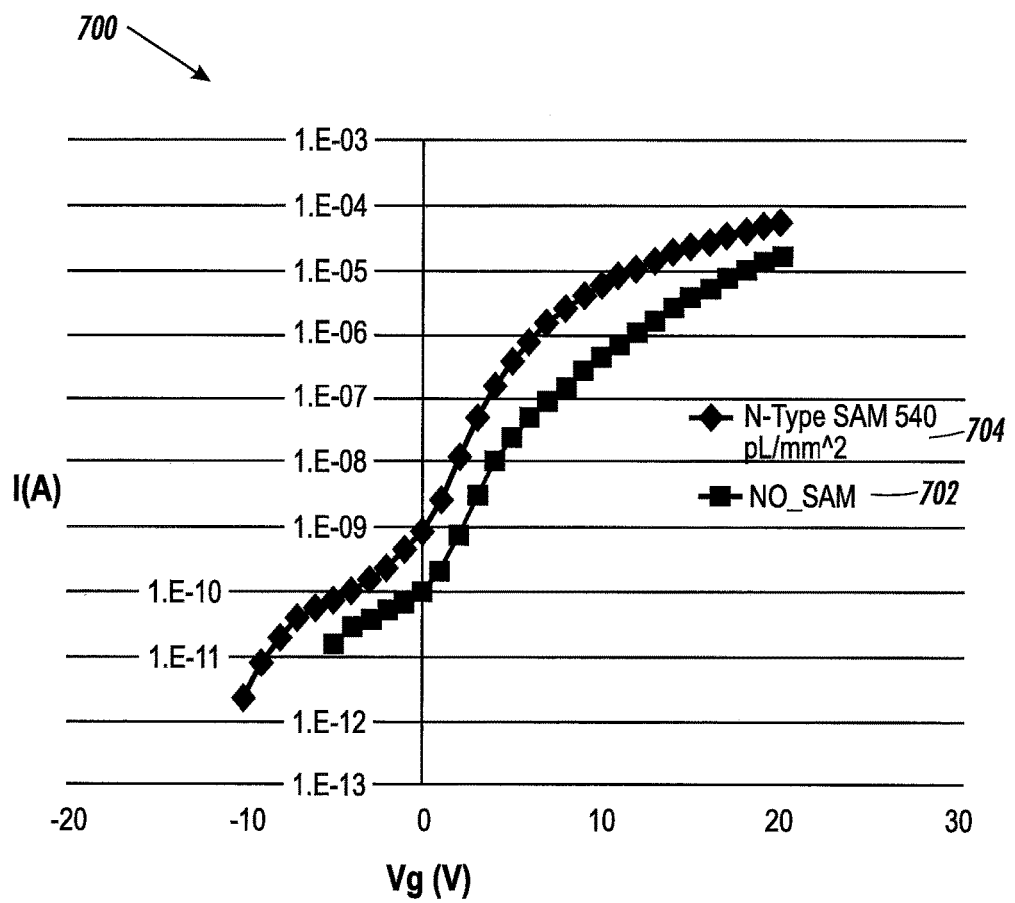
FIG. 7 is a graph of transistor transfer characterisitcs for a device according to FIG. 6

With attention to FIG. 7, shown is chart 700 which represents a process for n-type SAM according to FIG. 6. Chart 700 depicts transfer characteristics (i.e., current l(A) versus gate voltage (Vg (V)), with a width length ratio of W/L=3 mm/10 μm, at source/drive voltage of −10V. The chart compares an untreated device (blank—no surface modification) 702 OTFT with a OTFT with a n-type SAM having 540 pL/mm² droplet volume 704, where the treated OTFT (e.g., n-type SAM having 540 pL/mm² droplet volume) has a higher ON current and sharper subthreshold slopes.

Figure 8:
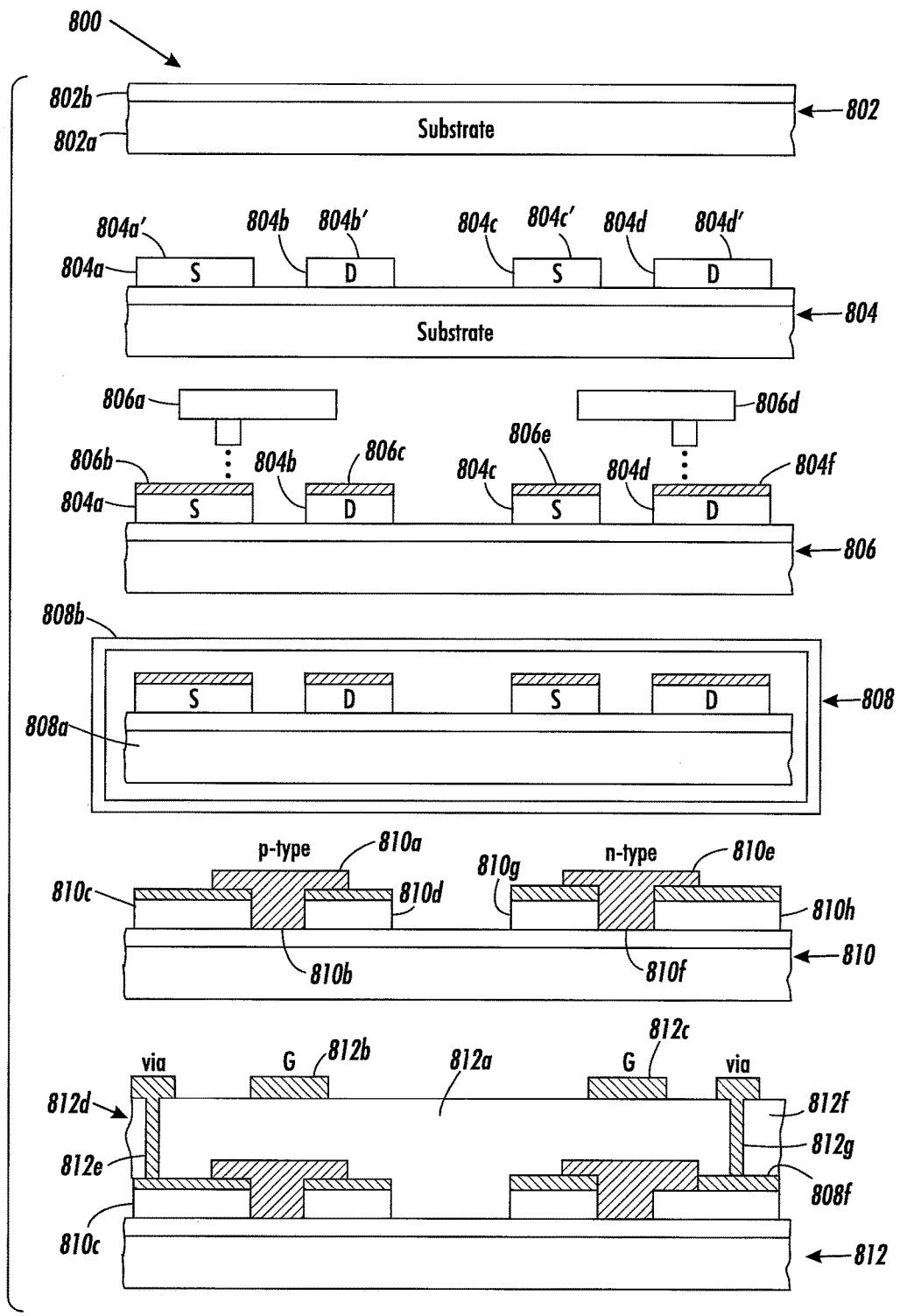
FIG. 8 illustrates processing steps for making a complementary top gate OTFT circuit with selective p-type electrode surface modifications and n-type electrode surface modifications according to the present disclosure.

Turning to FIG. 8, illustrated are processing steps 800 used to form a complementary top gate OTFT having the energy levels of both the electrodes for the p-type OTFT and the n-type OTFT modified.

Step 802 is similar to the previous embodiments where a substrate 802a and a buffer layer 802b are provided. Thereafter, as shown in step 804, a source electrode 804a and drain electrode 804b for a p-type OTFT are formed, along with a source electrode 804c and electrode 804d for a n-type OTFT. Also, source electrode 804a includes a surface 804a', drain electrode 804b includes a surface 804b', source electrode 804c includes a surface 804c', and the drain electrode 804d includes a surface 804d'.

It has been determined by the inventors that it is possible to modify electrodes for both the p-type OTFT and the n-type OTFT. In view of this in step 806 a printing system 806a is operated to print a surface work function modifier, as layer 806b on the source electrode 804a, and a layer 806c on the drain electrode 804b. In certain embodiments the nozzle of the printing system 806a is heated to maintain certain types of surface work function modifier material in a fluid state. Further in the processing step 806, a printer system 806d (which may be part of or separate from the printing system 806a) prints an other energy surface work function modifier as a layer 806e on source electrode 804c and a layer 806f on drain electrode 804d.

Turning to step 808, the sample 808a of the arrangement created by step 806 is placed in an oven (e.g., a vacuum oven) 808b to anneal the sample 808a as in the preceding embodiments. This heating (i.e., after the ink jetting or printing, etc.) acts to remove undesirable solvents that are otherwise present due to previous manufacturing steps. The described operations act to modify the surface energy level such as discussed in connection with FIG. 1.

Next in step 810, a p-type semiconductor material 810a is printed in a channel 810b between modified source electrode 808c and modified drain electrode 808d. Similarly, an n-type semiconductor material 810c is printed in a channel 810d between modified source electrode 808e and a modified drain electrode 808f.

Following these operations, the process moves to step 812, where a dielectric layer 812a is printed or deposited over the modified electrodes 808c, 808d, 808e, and 808f, as well as over the p-type semiconductor material 810a and n-type semiconductor material 810c. Thereafter, gates 812b and 812c are printed on a surface of the dielectric layer 812a. Then via or opening 812d is formed from the surface of the dielectric layer 812a to the modified source electrode 808c. Thereafter, a conductive material 812e is provided to form a conductive connection from the source electrode 808c to the surface of dielectric layer 812a. In a similar manner, via or opening 812f is formed in the dielectric layer 812a to the modified drain electrode 808f. Thereafter, a conductive material 812g is provided to form a conductive path from the modified drain electrode 808f to the surface of the dielectric layer 812a.

Figure 9:
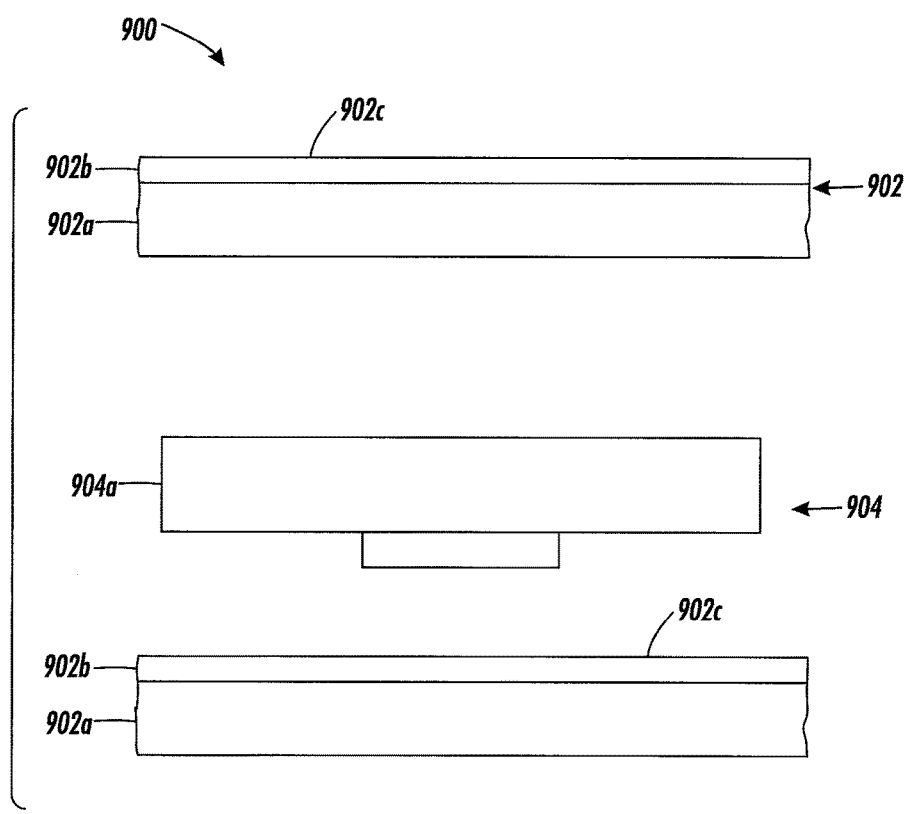
FIG. 9 illustrates a modification of the buffer layer optionally implemented in the processing steps shown in FIGS. 3, 6, and 8.

Turning to FIG. 9, illustrated is a process 900 which optionally is provided between steps 302 and 304 of FIGS. 3, 602 and 604 of FIGS. 6, and 802 and 804 of FIG. 8, or at another step as appropriate. In particular, illustrated is substrate 902a, similar to the substrates 302a, 602a, and 802a, and buffer layer 902b, similar to the buffer layers 302b, 602b, and 802b. As in the previous arrangements buffer layer 902a includes a surface which is identified herein as surface 902c.

In step 904, surface roughening device 904a is provided in operational association with the surface 902c of buffer layer 902b. The roughening device 904a is used to provide a roughening to the surface 902c prior to the further steps in the process as described in FIGS. 3, 6, and 8. Roughening step 904 may be accomplished by application of an argon plasma (Ar) or oxygen (O) treatment, such as by use of a roughening device (e.g., an argon or oxygen plasma generating device) 904a. Alternatively the roughening device may be any other device or arrangement which will provide appropriate roughening of the buffer surface. For the argon roughening the surface treatment includes providing Ar at 40-200 m Torr, 100W for approximately 30 seconds.

The roughing of surface 902c of buffer layer 902b is undertaken to insure an appropriate contact during the depositing of the p-type semiconductor material and the n-type semiconductor material. For example, the processes which are used to form the electrodes may leave the buffer layer surfaces (and/or electrodes) somewhat hydrophobic which will limit the wicking or spreading of the p-type and/or n-type semiconductor material. The roughening operations allows for a more complete spreading of the semiconductor material which in turn provides a stronger interface between the buffer layer (and/or electrodes) and the semiconductor material.

Figure 10:
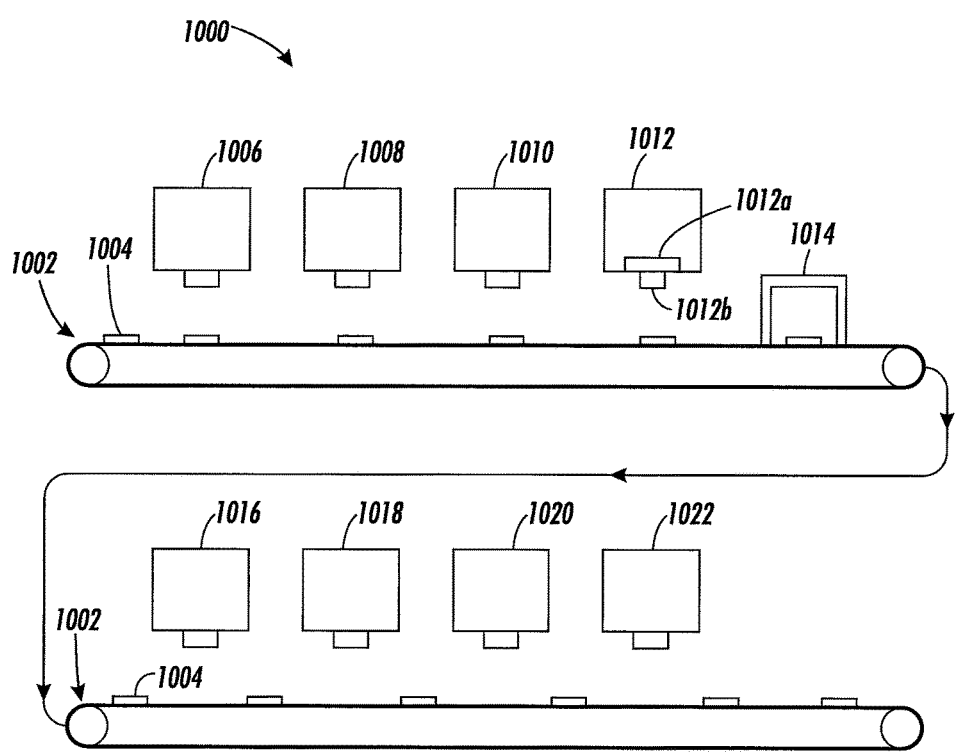
FIG. 10 illustrates a manufacturing system which permits a role-to-role manufacture of the complementary top gate OTFT circuits of FIGS. 3, 6, 8, and the processing step of FIG. 9.

Turning to FIG. 10 illustrated is a roll-to-roll processing system 1000 designed to form complementary top-gate OTFTs. Included is a roll-to-roll conveyor 1002 having the appropriate hardware and arrangement to move a substrate through processing steps as defined in the forgoing disclosure. The conveyor 1002 is designed to carry substrates 1004 through the processing operations.

Initially, a buffer printing system 1006 operates to deposit and otherwise form a buffer layer on the substrate 1004. Alternately the substrate may be prefabricated with the buffer layer. Next, a roughening station 1008 is optionally provided to roughen a surface of the buffer layer. An electrode generating station 1010 functions to deposit and otherwise form electrodes on to the surface of the buffer layer. Further included is an energy surface modification system 1012 which is employed to print or otherwise deposit surface work function modifier material for one of or both of the p-type OTFT and the n-type OTFT, selectively on the electrodes. It is noted that in at least some embodiments a heater 1012a is optionally associated with a nozzle 1012b of system 1012, in situations where the first and/or second surface work function modifiers are of a solution that requires a certain temperature to be applied in order to maintain the surface work function modifier in a flowing or liquid state.

Further located as part of the roll-to-roll system 1000, is a heater or oven 1014, such as but not limited to a vacuum oven configured for annealing operation. In certain embodiments the heater or oven and its operation may be optional dependent upon the materials being used as the surface work function modifiers. Following the heating operation the substrates which are being processed are moved to a dielectric forming station 1016, where a dielectric layer is printed or deposited over the material previously formed on the substrates. Next a metal depositing station 1016 is configured to deposit gate electrodes in accordance with the previously discussed processing steps. After the foregoing the system 1000 moves the substrates and layers formed thereon to via (or opening) forming station 1020 which, maybe a laser, mechanical drill, etc., which to form vias or openings in the dielectric layer. Finally, a conductive material depositing system 1022, such as a printer is provided to fill the previously formed vias or openings.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of fabricating a complementary top gate Organic Thin Film Transistor (OTFT) comprising:
   providing a substrate;
   patterning source and drain electrodes for a p-type OTFT and a n-type OTFT on at least one of a buffer layer on the substrate and the substrate itself;
   printing, by a printing system, at least one of (i) a first surface work function modifier onto surfaces of the source and drain electrodes for the p-type OTFT and (ii) a second surface work function modifier onto surfaces of the source and drain electrodes for the n-type OTFT, wherein the printing is done selectively and precisely onto the surfaces of the source and drain electrodes without printing on the buffer layer or the substrate;
   printing by the printing system, a p-type of semiconductor material into at least a channel region between the source and drain electrodes for the p-type OTFT;
   printing by the printing system, an n-type of semiconductor material into at least a channel region between the source and drain electrodes for the n-type OTFT;
   forming a dielectric layer over the p-type semiconductor material, the n-type semiconductor material and the source and drain electrodes including at least one of the (i) the modified surfaces of the drain and source electrodes for the p-type OTFT, and (ii) the modified surfaces of the drain and source electrodes for the n-type OTFT; and
   forming gate electrodes on a surface of the dielectric layer.

2. The method according to claim 1 further including at least one of (i) wherein only the surfaces of the source and drain electrodes for the p-type OTFT are modified, and (ii) wherein only the surfaces of the source and drain electrodes for the n-type OTFT are modified.

3. The method according to claim 1 further including at least one of (i) wherein only the surfaces of the source and drain electrodes for the p-type OTFT are modified, and (ii) wherein only the surfaces of the source and drain electrodes for the n-type OTFT are modified, and wherein all the electrodes are formed in a same step.

4. The method according to claim 1 further including dissolving the first surface work function modifier into a flowing state, wherein the dissolved first surface work function modifier is configured to modify the surfaces of the source and drain electrodes for the p-type OTFT, and providing at least one of (i) the dissolved first surface work function modifier for the p-type OTFT and (ii) the second surface work function modifier to the printing system.

5. The method according to claim 4 wherein the first surface work function modifier is a F4TCNQ composition.

6. The method according to claim 5 wherein the dissolving of the F4TCNQ composition is accomplished by dissolving 0.1 weight % F4TCNQ in dichlorobenzene.

7. The method according to claim 1 wherein the second surface work function modifier is selected from a group consisting of 4-Methyl (sulfanyl)thiophenol, 4-methoxythiophenol, 4-methylthiophenol, 4-aminothiophenol, and 4-nitrothiophenol nitrothiophenol.

8. The method according to claim 1 further including roughing the surface of at least the buffer layer, prior to the printing system printing at least one of (i) the first surface work function modifier onto the surfaces of the source and drain electrodes for the p-type OTFT, and (ii) the second surface work function modifier onto the surfaces of the source and drain electrodes for the n-type OTFT.

9. The method according to claim 1 wherein the steps forming the complimentary OTFT are undertaken in a roll to roll fabrication process.

10. The method according to claim 1 wherein for efficient charge carrier injection into p-type organic molecules of the p-type material, a work function of the surfaces of the source and drain electrodes for the p-type OTFT are modified to substantially match an energy level of a highest occupied molecular orbital (HOMO) of the p-type organic molecules.

11. The method according to claim 1 wherein for efficient charge carrier injection into n-type organic molecules of the n-type material, a work function of the surfaces of the source and drain electrodes for the n-type OTFT are modified to substantially match an energy level of the lowest unoccupied molecular orbital (LUMO) of the organic molecules of the n-type organic molecules.

12. The method according to claim 1 wherein the printing includes depositing droplets to form a volume in a range of between approximately 100 pL/mm$^2$ to 10 nL/mm$^2$ of at least one of (i) the first surface work function modifier and the (ii) second surface work function modifier, on a surface area between approximately 100 pL/mm$^2$ to 10 nL/mm$^2$) of at least one of (i) the source and drain electrodes for the p-type OTFT, and (ii) the source and drain electrodes for the n-type OTFT.

13. The method according to claim 1 wherein the printing system deposits droplets with a 60 μm to 80 μm jetting nozzle on at least one of (i) the source and drain electrodes for the p-type OTFT, and (ii) the source and drain electrodes for the n-type OTFT.

14. The method according to claim 1 wherein a nozzle head of the printing system is maintained at a temperature of between 30° C. to 60° C. to maintain the first surface work function, in the form of a F4TCNQ composition in a stable flowing state.

15. The method according to claim 1 further including heating at least one of (i) the printed first surface work function modifier and the surfaces of the source and drain electrodes for the p-type OTFT to form modified surfaces of the source and drain electrodes for the p-type OTFT, and (ii) the printed second surface work function modifier and the surfaces of the source and drain electrodes for the n-type OTFT, to form modified surfaces of the source and drain electrodes for the n-type OTFT.

16. The method according to claim 1, wherein a step of removal of unwanted surface work function modifier is not required.

17. A method of fabricating a complementary top gate Organic Thin Film Transistor (OTFT) comprising:
provideing a substrate;
patterning source and drain electrodes for a p-type OTFT and a n-type OTFT on at least one of a buffer layer on the substrate and the substrate itself;
printing, by a printing system, at least one of (i) a first surface work function modifier onto surfaces of the source and drain electrodes for the p-type OTFT and (ii) a second surface work function modifier onto surfaces of the source and drain electrodes for the n-type OTFT;
printing by the printing system, a p-type of semiconductor material into at least a channel region between the source and drain electrodes for the p-type OTFT;
printing by the printing system, an n-type of semiconductor material into at least a channel region between the source and drain electrodes for the n-type OTFT;
roughing a surface of at least one of the buffer layer and the substrate, prior to the printing system printing at least one of (i) the first surface work function modifier onto the surfaces of the source and drain electrodes for the p-type OTFT, and (ii) the second surface work function modifier onto the surfaces of the source and drain electrodes for the n-type OTFT, wherein the roughing of at least one of the buffer layer and the substrate is accomplished by providing at least one of argon plasma treatment and oxygen treatment to the surface of the buffer layer;
forming a dielectric layer over the p-type semiconductor material, the n-type semiconductor material and the source and drain electrodes including at least one of the (i) the modified surfaces of the drain and source electrodes for the p-type OTFT, and (ii) the modified surfaces of the drain and source electrodes for the n-type OTFT; and
forming gate electrodes on a surface of the dielectric layer.

18. The method according to claim 17, wherein the printing is done selectively and precisely onto the surfaces of the source and drain electrodes without printing on the buffer layer or the substrate.

19. The method according to claim 18, wherein a step of removal of unwanted surface work function modifier is not required.

20. The method according to claim 17 wherein the steps forming the complimentary OTFT are undertaken in a roll to roll fabrication process.

* * * * *